United States Patent [19]
Lorimer et al.

[11] Patent Number: 5,993,165
[45] Date of Patent: *Nov. 30, 1999

[54] IN SITU GETTER PUMP SYSTEM AND METHOD

[75] Inventors: D'arcy H. Lorimer, Pismo Beach; Gordon P. Krueger, Nipomo, both of Calif.

[73] Assignee: SAES Pure Gas, Inc., San Luis Obispo, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/810,619

[22] Filed: Feb. 28, 1997

Related U.S. Application Data

[62] Division of application No. 08/332,564, Oct. 31, 1994, Pat. No. 5,685,963.

[51] Int. Cl.⁶ .................................................... F04B 37/02
[52] U.S. Cl. ................................................. 417/51; 417/48
[58] Field of Search ........................................ 417/51, 48

[56] References Cited

U.S. PATENT DOCUMENTS

| | | | |
|---|---|---|---|
| 2,965,218 | 12/1960 | Jayne | 417/51 |
| 3,167,678 | 1/1965 | Griessel | 417/51 |

(List continued on next page.)

FOREIGN PATENT DOCUMENTS

| | | |
|---|---|---|
| 0 144 522 | 6/1985 | European Pat. Off. . |
| 0 246 158 A1 | 11/1987 | European Pat. Off. . |

(List continued on next page.)

OTHER PUBLICATIONS della Porta, Paolo, "Gettering, an Integral Part of Vacuum Technology," American Vacuum Society, 39th National Symposium, Nov. 9–13, 1992.

della Porta et al., "The Characteristics of Getter Pumps, Getter Ion Pumps and their Combination," *SAES Technical Report TR* (Saes Getters S.p.A.), pp. 3–4.

Ferrario et al., "New Types of Volume Gettering Panels for Vacuum Problems in Plasma Machines," Proceedings of the 7th International Vacuum Congress & 3rd International Conference on Solid Surfaces, Vienna, 1977, pp. 359–362.

Cecchi, J.L., "Impurity Control in TFTR," *Journal of Nuclear Materials*, vol. 93 & 94, 1980, pp. 28–43.

(List continued on next page.)

*Primary Examiner*—Timothy S. Thorpe
*Assistant Examiner*—Cheryl J. Tyler
*Attorney, Agent, or Firm*—Hickman & Martine, LLP

[57] ABSTRACT

A wafer processing system including a processing chamber, a low pressure pump coupled to the processing chamber for pumping noble and non-noble gases, a valve mechanism coupling a source of noble gas to the processing chamber, an in situ getter pump disposed within the processing chamber which pumps certain non-noble gases during the flow of the noble gas into the chamber, and a processing mechanism for processing a wafer disposed within the processing chamber. Preferably, the in situ getter pump can be operated at a number of different temperatures to preferentially pump different species of gas at those temperatures. A gas analyzer is used to automatically control the temperature of the getter pump to control the species of gasses that are pumped from the chamber. A method for processing a wafer of the present invention includes the steps of placing a wafer within a processing chamber and sealing the chamber, flowing a noble gas into the chamber while simultaneously pumping the chamber with an external low pressure pump and with an in situ getter pump disposed within the chamber which pumps non-noble gases, and processing the wafer within the chamber while the noble gas continues to flow. The method also preferably includes the steps of monitoring the composition of the gas within the chamber and controlling the temperature of the getter material based upon the analysis of the composition.

14 Claims, 8 Drawing Sheets

U.S. PATENT DOCUMENTS

| | | |
|---|---|---|
| 3,203,901 | 8/1965 | della Porta . |
| 3,662,522 | 5/1972 | della Porta et al. . |
| 3,780,501 | 12/1973 | della Porta et al. . |
| 3,820,919 | 6/1974 | Katz . |
| 3,892,650 | 7/1975 | Cuomo et al. . |
| 3,926,832 | 12/1975 | Barosi . |
| 4,062,319 | 12/1977 | Roth et al. . |
| 4,071,335 | 1/1978 | Barosi . |
| 4,137,012 | 1/1979 | della Porta et al. . |
| 4,181,161 | 1/1980 | Kraus . |
| 4,269,624 | 5/1981 | Figini . |
| 4,306,515 | 12/1981 | Winkler . |
| 4,306,887 | 12/1981 | Barosi et al. . |
| 4,312,669 | 1/1982 | Boffito et al. . |
| 4,405,487 | 9/1983 | Harrah et al. . |
| 4,428,856 | 1/1984 | Boyarina et al. . |
| 4,449,373 | 5/1984 | Peterson et al. . |
| 4,460,673 | 7/1984 | Sukigara et al. . |
| 4,479,361 | 10/1984 | Osher . |
| 4,515,528 | 5/1985 | Young . |
| 4,571,158 | 2/1986 | Maegdefessel ............................. 417/51 |
| 4,704,301 | 11/1987 | Bauer et al. . |
| 4,907,948 | 3/1990 | Barosi et al. . |
| 5,015,226 | 5/1991 | Polaschegg . |
| 5,221,190 | 6/1993 | Romer et al. . |
| 5,238,469 | 8/1993 | Briesacher et al. . |
| 5,242,559 | 9/1993 | Giorgi . |
| 5,254,096 | 10/1993 | Rondelet et al. . |
| 5,320,496 | 6/1994 | Manini et al. . |
| 5,324,172 | 6/1994 | Manini et al. ............................. 417/51 |
| 5,340,460 | 8/1994 | Kobayashi et al. . |
| 5,357,760 | 10/1994 | Higham . |

FOREIGN PATENT DOCUMENTS

| | | |
|---|---|---|
| 0 693 626 A1 | 1/1996 | European Pat. Off. . |
| 2 370 357 | 6/1978 | France . |
| 2 511 709 | 8/1981 | France . |
| 1 011 996 | 7/1957 | Germany . |
| 22 04 714 | 10/1979 | Germany . |
| 41 10 588 A1 | 10/1992 | Germany . |
| 58-117372 | 7/1983 | Japan ..................................... 417/51 |
| 60-222572 | 11/1985 | Japan . |
| 62-113876 | 5/1987 | Japan . |
| 4-5480 | 4/1990 | Japan . |
| 3-189380 | 8/1991 | Japan ..................................... 417/51 |
| 5-99538 | 4/1993 | Japan ..................................... 417/313 |
| 7-324679 | 12/1995 | Japan . |
| 1168263 | 10/1969 | United Kingdom . |
| 2 077 487 | 12/1981 | United Kingdom . |
| 2 100 143 | 12/1982 | United Kingdom . |
| WO 94/02958 | 2/1994 | WIPO . |
| WO 94/02957 | 12/1994 | WIPO . |
| WO 96/13620 | 5/1996 | WIPO . |

OTHER PUBLICATIONS

Ferrario, B., "Non–evaporable Getters in Plasma and Particle Physics Experiments," SAES Getters S.p.A., Bombay, India, 1983, pp. 175–188.

"System Grows Complex Single Crystal Materials," *Solid State Technology*, vol. 26, No. 7, Jul. 1983, pp. 39–40.

Giorgi, T. et al., "An Updated Review of Getters and Gettering," *Journal of Vacuum Science and Technology A*, vol. 3, No. 2, Mar./Apr. 1985, pp. 417–423.

Ferrario, B., "Use of Getters in Vacuum Systems–Extended Abstract," *Vaccuum*, vol. 37, No. 3/4, 1987, pp. 375–377.

Sciuccati, F. et al., "In situ Pumping with NEG (non–evaporable getters) during Vacuum Processing," *Vacuum*, vol. 38, Nos. 8–10, 1988, pp. 765–769.

"SORB–AC® Getter Wafer Modules and Panels," SAES Getters S.p.A., Italy, Oct. 1988.

Briesacher et al., "Recommended Pumping Semiconductor Manufacturing," Kayoiku Kaikan, 'Applications for Non–Evaporable Getter Pumps in Semiconductor Processing Equipment,' $10^{th}$ Symposium on ULSI Ultra Clean Technology, Nov. 9–10, 1989.

Briesacher, J. et al., "Non–Evaporable Getter Pumps for Semiconductor Processing Equipment," Ultra Clean Technology, vol. 1, 1990, pp. 49–57.

Ferrario et al., "Chemical Pumping and its Applications in High and Ultra High Vacuum," *Le Vide, les Couches Minces–Supplement au No. 252*, May–Jul. 1990, pp. 103–105.

Lorimer et al., "Enhanced UHV Performance with Zirconium–Based Getters," *Solid State Technology*, Sep. 1990, pp. 77–80.

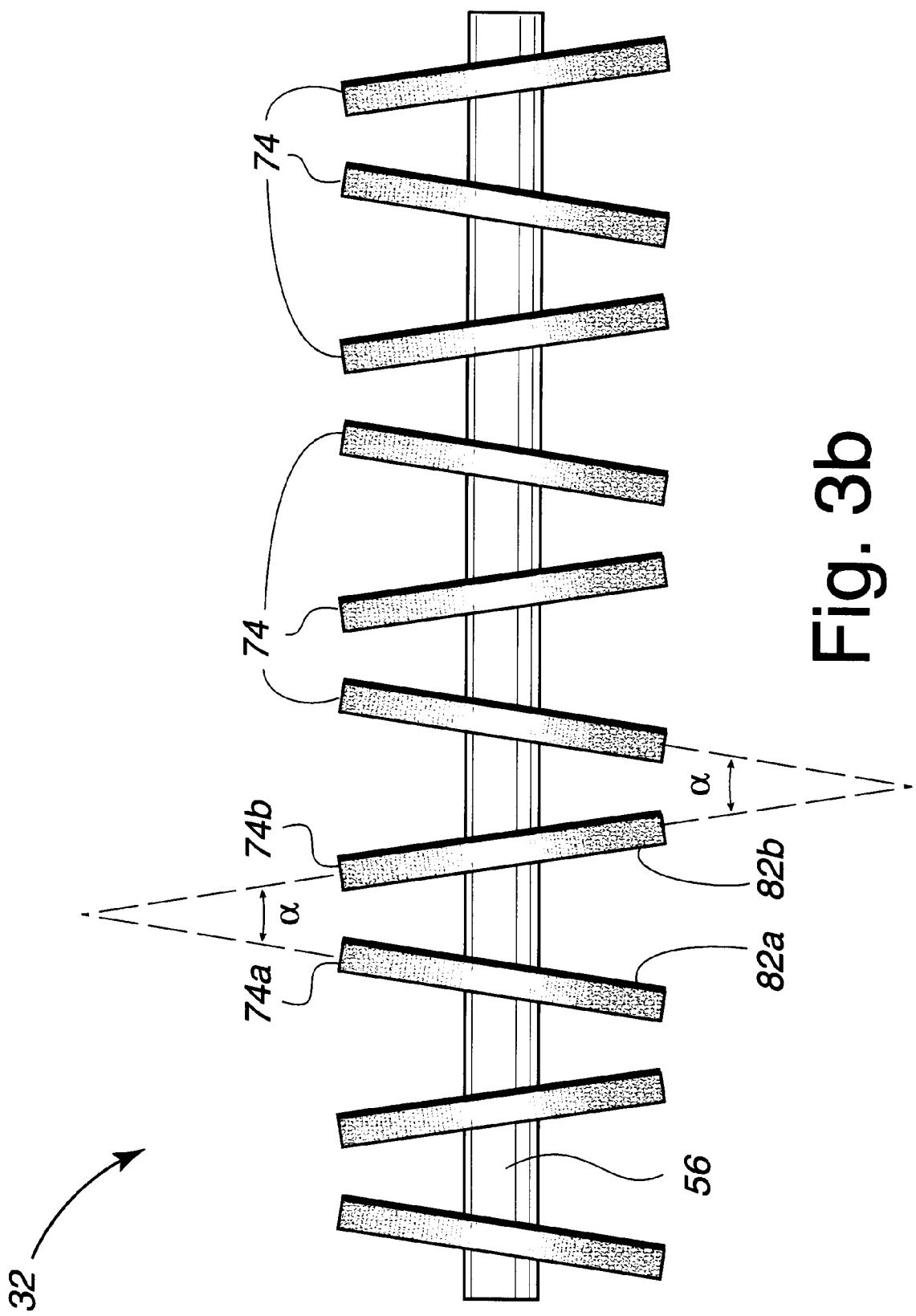

IN SITU GETTER PUMP SYSTEM AND METHOD

This is a Divisional application of prior application Ser. No. 08/332,564 filed on Oct. 31, 1994, U.S. Pat. No. 5,685,963.

BACKGROUND OF THE INVENTION

This invention relates generally to ultra-high vacuum systems, and more particularly to in situ getter pumps used in ultra-high vacuum systems.

There are a number of processes which require ultra-high vacuum levels of, for example, $10^{-7}$ to $10^{-12}$ Torr. For example, high vacuum physics machines such as cyclotrons and linear accelerators often require a vacuum of the order of $10^{-8}$–$10^{-12}$ Torr. Also, in the semiconductor manufacturing industry, ultra-high vacuums of approximately $10^{-7}$–$10^{-9}$ Torr are often required in semiconductor processing equipment.

Several pumps are typically used in series or parallel to achieve ultra-high vacuum levels within a chamber. A mechanical (e.g. oil) pump is often used to reduce the pressure within a chamber to approximately 30–50 millitorr. These are often referred to as "high pressure" pumps since they only pump relatively high pressure gasses. Then, high or ultra-high vacuum pump systems, such as a molecular pump, ion pump, cryopump, turbo pump, etc. are used to reduce the pressure to approximately $10^{-7}$–$10^{-9}$ Torr. These are often referred to as "low pressure" pumps since they pump low pressure gasses. The pump-down time for a particular chamber can range from minutes to hours to days depending upon such factors as the size of the chamber, the capacity of the pumps, the conductance from the chamber to the pumps, and the desired final pressure.

In certain ultra-high vacuum applications, getter pumps have been used in conjunction with the aforementioned mechanical, molecular, and cryopumps. A getter pump includes getter materials (metal alloys) which have an affinity for certain non-noble gases. For example, depending upon the composition and temperature of the getter material, getter pumps have been designed which preferentially pump certain non-noble gases such as water vapor and hydrogen.

For example, getter pumps provided by SAES Getters, S.p.A. of Milan, Italy have been installed in particle accelerators for a number of years. The getter pump typically includes getter material encased in a stainless steel container. Getter pumps can operate from ambient temperatures to about 450° C. depending upon on the species of gas to be pumped, the getter composition, etc. A preferred getter material for prior art SAES getter pumps is ST707™ getter material (which is an alloy of Zr-V-Fe) and which is produced by SAES Getters, S.p.A. of Milan, Italy. Another such material is ST101™ getter alloy, also available from SAES Getters, S.p.A., which is an alloy of Zr-Al. Some of these prior art getter pumps can be considered "in situ" pumps in that they are disposed within the high vacuum physics machines.

It has also been suggested that getter pumps be provided for semiconductor processing equipment. For example, in an article entitled "Non-Evaporable Getter Pumps for Semiconductor Processing Equipment" by Briesacher et al. some years back, it is suggested that any application which uses getters to purify processed gases for semiconductor processing can also utilize non-evaporable getter pumps for in situ purification and for the selective pumping of impurities.

The aforementioned Briesacher reference discloses that there are two possible operating scenarios for the use of getter pumps in a sputtering system. The first is the addition of the getter pump to the system to operate in parallel with conventional pumps (e.g. mechanical and cryopumps) of the system. In this scenario, the operation of the system is not modified in any way, and the getter pump merely serves as an auxiliary pump to lower the partial gas pressure of certain components of the residual gas in the chamber. The second scenario is to fill the chamber to a pressure in the range of $3 \times 10^{-3}$ to $6 \times 10^{-3}$ Torr, stopping the argon flow into the chamber, and sealing the chamber. The getter pump is then said to act as an "in situ" purifier for the argon. However, as discussed below, the pump is not truly "in situ" in that the active material is not within the volume of the processing chamber. An experimental processing chamber using such a getter pump was implemented at the department of electronics, Tohoku University, Japan under the guidance of Dr. Ohmi for some years.

The *Briesacher* reference discloses that a getter pump can be used in conjunction with a sputtering system, which is a type of semiconductor processing equipment. In one example of a typical sputtering system, a noble gas (usually argon) is pumped into a chamber and a plasma is created. The plasma accelerates argon ions towards the target causing material to become dislodged and to settle on the surface of the wafer. Getter pumps are well adapted for use with sputtering systems, since the only desired processing gas is a noble gas which is not pumped by the getter pump. Therefore, the getter pump can remove impurity gases from a sputtering chamber without affecting the flow of the noble gas required for the sputtering process.

The Briesacher reference was primarily an academic analysis of the practicality of using non-evaporable getter pumps in semiconductor processing equipment. Therefore, very little practical application of the theory is disclosed. Furthermore, while the Briesacher article uses the term "in situ" to describe scenario for the use of a getter pump, it is clear from the description that the getter pump is external to the chamber and is considered "in situ" only in that when the chamber is sealed and when no argon is flowing into the chamber, the volume within the getter pump can be considered to be connected to the chamber volume. However, it is not truly "in situ" in that the getter pump surfaces are within a volume that is connected to the chamber volume through a restrictive throat, which greatly limits the conductance between the chamber and the pump. For example, pumping through a throat of a pump may reduce conductance by 25% or more, and pumping through a throat of a pump having a heat shield (to shield the active members from the cryopump from heated members of the processing chamber) may reduce conductance 60% or more.

Sputtering systems used for the manufacture of integrated circuits have certain operational features which can be enhanced by in situ getter pumps in fashion that have not been addressed in the prior art. One such feature is the fact that production sputtering apparatus must operate at a number of different pressures and with different gas compositions. This feature, for example, is not present in particle accelerators, such as the aforementioned Princeton University particle accelerator, which are typically maintained at high vacuum. Nor was this feature addressed by the aforementioned *Briesacher* reference. More particularly, a sputter chamber of a commercial sputtering machine is often exposed to three entirely different environments. A first environment is present when the chamber is opened to the ambient atmosphere because of, for example, routine maintenance or for repair. Under such conditions the chamber is contaminated with atmospheric gases and pollutants. A second environment is present when the chamber is operated under ultra-high vacuum conditions, for example, less than $10^{-7}$ Torr, such as during loading and unloading of the chamber, and during pump-down to "base pressure" prior to processing. Finally, a third environment is present during processing, when the pressure of the argon gas in the sputtering chamber is at a pressure of a few millitorr.

In order to cycle between these various operating environments, a typical sputtering chamber is be coupled to a mechanical (high pressure) pump and a cryopump (low pressure pump). The mechanical pump will reduce the pressure in the chamber to approximately 30–50 millitorr and the cryopump (or other high vacuum pump, such as a turbo pump) will then be used to reduce the pressure in the chamber to approximately $10^{-7}$–$10^{-9}$ Torr.

It is commercially desirable to minimize the "transient" time between these various operating environments. For example, when going from atmospheric pressure to ultra-high vacuum conditions, it often takes 600–700 minutes for a traditional mechanical pump and cryopump to achieve the desired vacuum levels. Therefore, after every routine maintenance or repair, it can take ten hours or more for the sputter chamber to be ready to accept a wafer for processing. This can result in thousands or millions of dollars of "down-time" for the sputtering machine over its lifetime.

Since the total "pump down" time is more dependent upon the cryopump than the mechanical pump, one solution is to increase the size of the cryopump and the conductance to the pump. By "conductance" it is meant the ease with which a fluid (gas in this instance) flows from one volume (e.g. the processing chamber) to another volume (e.g. the pump chamber). Conductance is limited by the aperture size between the two chambers, which is typically the cross-sectional area of the throat of the cryopump, and the directness of the path between atoms, molecules, and particles to be pumped and the active surfaces within the cryopump. Unfortunately, increasing the size and conductance of the cryopump similarly increases the amount of argon that must flow into the process chamber to support the sputtering process. This has two undesirable side-effects. First, processing costs increase dramatically due to the high expense of argon gas. Second, the large amount of argon being pumped by the cryopump will quickly saturate the pump, requiring frequent "regenerations" (where trapped materials are released from the pump) and, therefore, more down-time for the system. In consequence, this solution of increasing the cryopump size is not commercially viable.

It is, in general, desirable to have a large capacity cryopump so that the period of time between regeneration cycles can be as long as possible. However, large cryopumps typically have large throats and large conductances. In the prior art, a baffle plate including, for example, one or more holes or other apertures can be placed over the mouth of the cryopump to reduce its conductance to acceptable levels. Alternatively, a smaller cryopump with a smaller conductance could be used without a baffle plate, or other restricting mechanisms can be used. However, with the smaller cryopump, the period of time between regeneration cycles would be less. Also, the base pressure with either of these solutions would be higher than with an unrestricted large cryopump. This is undesirable since the lower the base pressure, the cleaner the chamber.

Another possible solution to the problem of pumping a chamber of a sputter machine is to provide an additional cryopump, where one cryopump has a large conductance to pump-down the chamber to base pressures, and the other cryopump has a smaller conductance for pumping the chamber during processing. However, this solution also has its drawbacks. For one, cryopumps tend to take a fair amount of space since they require both liquid helium cryogenics and liquid nitrogen cryogenics to operate. Therefore, it is undesirable to add an additional cryopump in the often cramped space around semiconductor manufacturing equipment. Also, since cryopumps are quite expensive items, this would be an expensive solution. Furthermore, the smaller cryopump would have to be regenerated on a frequent basis. Also, each cryopump would require expensive and bulky gate valves and control systems. Finally, the chamber would likely have to be re-designed to accommodate two cryopumps.

Another possible solution would be to use a baffle plate having a variable size orifice. While this is theoretically appealing, such baffle plates for large cryopumps (e.g. cryopumps with 8" mouths) are not commercially available and are likely to be quite expensive and complicated to make. Furthermore, there may be some contamination problems associated with the mechanisms of a variable orifice.

Getter pumps have the interesting characteristic that they can preferentially pump certain gases. For example, by changing the composition of the material (typically a metal alloy), and its operating temperature, different gases are selectively pumped. For example, the aforementioned ST707 alloy preferentially pumps many non-noble gases at a temperature of about 350° C., and preferentially pumps hydrogen gas at room temperatures (about 25° C.). This characteristic of getter materials has been used to purify noble gases and nitrogen as disclosed in U.S. Pat. No. 5,238,469, issued Aug. 24, 1993 to Briesacher et al., assigned to SAES Pure Gas, Inc., which is incorporated herein by reference. However, the prior art does not disclose the use of an in situ getter pump which operates at several temperatures to preferentially pump several species of gases.

SUMMARY OF THE INVENTION

A wafer processing system of the present invention includes a processing chamber, a low pressure pump, and an in situ pump located within the processing chamber. The low pressure pump is preferably a cryopump that is coupled to the processing chamber with a throttle plate. A valve mechanism couples a source of noble gas to the processing chamber such that the noble gas flows continuously into the processing chamber and is pumped out of the chamber with the low pressure pump. The in situ pump, which is preferably a getter pump, pumps non-noble gas during the flow of the noble gas into the chamber, while pumping essentially none of the noble gas.

The getter pump preferably includes one or more getter modules, each supplied with a heater. One getter module can be operated at a first temperature such that it preferentially pumps certain gases, such as water vapor, while another module can be operated at a second temperature such that it can pump a different gas, such as hydrogen. Alternatively, a single module can be provided which is heated to a first temperature to preferentially pump a first gas, and is then heated to a second temperature to preferentially pump a second gas. Heat shields may be used to isolate the getter material from heated or cooled surfaces within the chamber, and therefore allow independent temperature control of the getter material.

The wafer processing system preferably includes a gas analyzer coupled to the chamber and a controller having an input coupled to the gas analyzer and an output coupled to the heater. This automated control of the heaters allows a first species of gas to be pumped by operating the getter pump at a first temperature, and then causing a second species of gas to be pumped by operating the getter pump at a second temperature after the concentration level of the first species has dropped to a desired level. This permits the getter pump to preferentially pump gasses based upon the gas compositions within the chamber.

A processing chamber in accordance with the present invention includes a sealable enclosure and an in situ getter pump system disposed within the enclosure which is capable of operating at more than one temperature, such that different non-noble gases are preferentially pumped at different temperatures. The in situ getter pump includes a heater which is controlled to preferentially pump either non-noble gasses (other than hydrogen) or hydrogen, depending upon the temperature of the getter material. Preferably, the processing chamber includes a gas analyzer and a controller having an input coupled to the gas analyzer and an output coupled to the heater.

The present invention further includes several methods for processing a wafer. More particularly, a method for processing a wafer in accordance with the present invention includes the step of placing a wafer within a processing chamber and sealing the chamber, flowing a noble gas into the chamber while simultaneously pumping the chamber with an external low pressure pump and with an in situ pump disposed within the chamber which pumps non-noble gases, and processing the wafer within the chamber while the noble gas continues to flow. Preferably, before the step of flowing a noble gas into the chamber, the method includes the step of simultaneously pumping the chamber with an external low pressure pump and with the in situ pump to achieve a base pressure. The method also preferably includes the step of monitoring the composition and concentration of the gas within the chamber and controlling the temperature of the getter material based upon the analysis. Alternatively, the temperature of the getter material can be controlled in a preprogrammed fashion or by some other non-feedback methodology. In this way, the adsorption properties of the getter material can be adjusted to pump a desired impurity from within the noble gas stream.

An advantage of this invention is that a system and method are provided which are compatible with the diverse operating conditions of semiconductor manufacturing equipment chambers. By providing an in situ getter pump, transient times in semiconductor manufacturing equipment can be much reduced, thereby reducing equipment downtime and thus increasing productivity and profitability.

In particular, it is advantageous to operate one or more getter modules at different temperatures to preferentially pump selected gases from within a sputtering system chamber. By using a gas analyzer to automatically control the temperature of the getter modules, pump-down time can be greatly reduced.

Furthermore, it is found to be advantageous to use an in situ getter pump in conjunction with a cryopump. Since cryopumps are very efficient at pumping noble gases such as argon and since getter pumps pump essentially no noble gases, the operation of the getter pump does not interfere with or influence the flow of noble gasses within the chamber. Furthermore, since the in situ getter pump assists the cryopump in pumping down the chamber, a low-capacity cryopump can be used or a large, baffled cryopump can be used while still obtaining the desired result of lower transient periods.

These and other advantages of the present invention will become apparent upon reading the following detailed descriptions and studying the various figures of the drawings.

BRIEF DESCRIPTION OF THE DRAWINGS

FIG. 3b is a side elevational view of another embodiment of a getter module in accordance with the present invention;

DETAILED DESCRIPTION OF THE PREFERRED EMBODIMENTS

Figure 1:
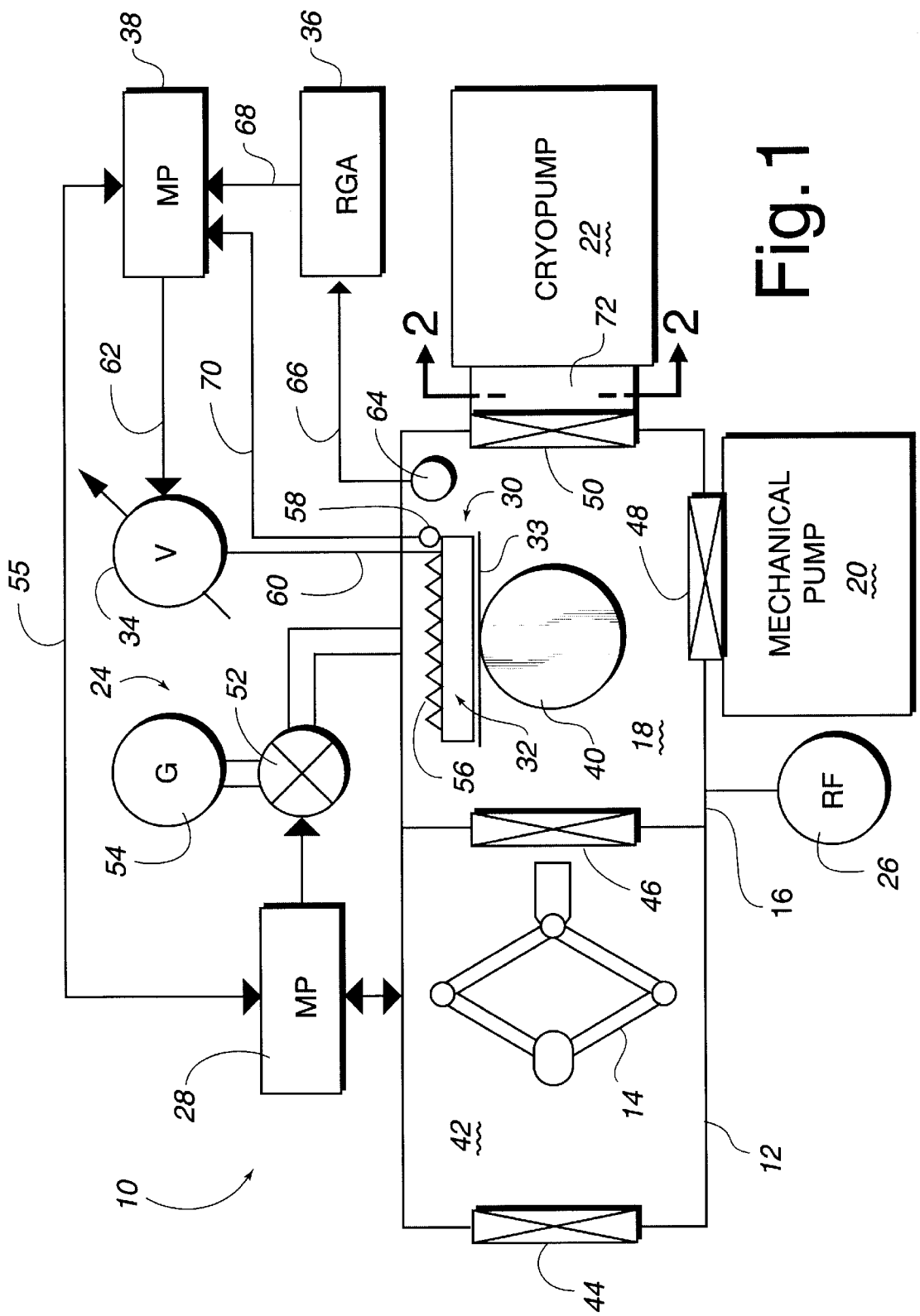
FIG. 1 is a system diagram illustrating a semiconductor processing apparatus including an in situ getter pump system in accordance with the present invention.

In FIG. 1, a wafer processing system 10 includes a first enclosure 12 for a robotic wafer handler 14, and a second enclosure 16 defining a processing chamber 18. The system 10 also includes a mechanical pump 20, a cryopump 22, a gas delivery system 24, a plasma generator 26 for creating a plasma, and a microprocessor based controller 28 for controlling much of the operation of wafer processing 10. The present invention also includes an in situ getter system pump 30 including a getter module 32, a shield 33, a controllable electrical power source 34, a residual gas analyzer (RGA) 36, and a microprocessor based controller 38. The wafer processing system 10 processes a semiconductor 40 placed within chamber 18 by the robotic wafer handler 14.

The manufacturing details of the first enclosure 12 and the robotic wafer handler 14 are well known to those skilled in the art. The enclosure 12 defines a robot chamber 42 that can be accessed through slit valves 44 and 46. The robot chamber is typically maintained at ultra-high vacuum levels of less than $10^{-7}$ Torr. The purpose of the robot 14 is to automatically place wafer 40 within the processing chamber 18 through an open slit valve 46 and to remove a processed wafer 40 from the chamber 18 through the slit valve 46 after the process has been completed. Just before the slit valve 46 is opened, the pressures within processing chamber 18 and the robotic chamber 42 are preferably at about the same level to minimize turbulence as the slit valves are opened. During the processing of the wafer 40, the slit valve 46 is closed. The robotic wafer handler 14 and gate valves 44 and 46 are all controlled by the system controller 28.

The second enclosure 16 which defines the process chamber 18 is also of conventional design. It, like the first enclosure 12, is preferably made from a strong, durable material such as stainless steel. In addition to the slit valve 46, a pair of valves 48 and 50 couple the mechanical pump 20 and the cryopump 22, respectively, to the chamber 18. If the chamber 18 has been vented to the atmosphere (such as for maintenance or repair), the valve 48 is opened and the mechanical pump is used to pump down the chamber to about 30 millitorr. At that time, the valve 48 is closed and the cryopump valve 50 is opened to continue pumping down the system to about $10^{-9}$ Torr. Preferably, the getter pump 30 is operated in conjunction (i.e. concurrently) with the operation of the cryopump 22. When the chamber has reached a low enough "base pressure" the processing of the wafer 40 can begin. Base pressure is typically lower than $10^{-7}$ Torr.

The "pump down" process described above is, of course, a somewhat simplified description, as will be appreciated by those skilled in the art. A more complete description is as follows. After the chamber 18 is partially pumped-down by mechanical pump 20, the mechanical pump 20 is turned off and is isolated by valve 48, and the valve 50 to the cryopump 22 opened. The chamber is then typically "baked out" with heat lamps (not shown) to release water vapor and other gasses from the walls and internal components of the chamber 18 which are pumped by cryopump 22. Also, the getter pump 30 is "activated" by heating the getter material of the getter pump to a high temperature, e.g. 450° C. This activation of the getter pump 30 is required because the getter material becomes "passivated" upon exposure to the atmosphere, and the activation period may overlap with the bake-out period. However, the bake out period and the activation period need not coincide. Once the chamber has been baked-out and the getter material activated, the getter pump 30 is turned on to simultaneously pump with cryopump 22 to rapidly bring the chamber 18 down to base pressure. Semiconductor processing can then proceed, as will be appreciated by those skilled in the art.

To initiate processing in a sputter system, the controller 28 causes a valve 52 to open allowing a noble gas (typically argon) from a gas source 54 to flow into chamber 18. Since cryopump 22 is still operating, the argon gas and certain by-products of the sputtering process are drawn from the chamber 18. The valve 52 is adjusted such that the argon pressure within the chamber 18 is at a few millitorr, e.g. $1 \times 10^{-3}$ to $6 \times 10^{-3}$ millitorr. Since the in situ getter pump 30 does not pump argon (which is a noble gas), it does not substantially affect the argon flowing into the chamber 18. However, the getter pump 30 does pump certain non-noble gases during the flow of argon gas through the chamber 18 as will be discussed in greater detail subsequently.

As used herein, "in situ getter pump" will refer to a getter pump where the active elements, i.e. the active getter material, is physically located within the same volume of space as the wafer being processed. In effect, the getter pump chamber has become the process chamber and vice versa. As such, the conductance between the in situ getter material and the process chamber is very high compared to the coupling of an external getter pump to the chamber through a gate valve, conduit, the throat of a pump, past a heat shield, etc. For example, with an in-situ getter pump of the present invention with a heat shield 33, more than 75% (typically more than 85%) of maximum theoretical pumping speed can be achieved, as compared to at best 75% (typically as low as 35%) of maximum theoretical pumping speed for an external getter pump coupled to the processing chamber with a gate valve or the like. It should be noted that conductance and pumping speed are directly related, and that pumping speed is being referred to as a relative percentage of a theoretical maximum pumping speed as if there were no obstructions between a given molecule and a getter surface of the getter pump.

The addition of an in situ gettering system of the present invention can therefore provide a two or three time improvement in pumping speed over prior art getter pumps coupled to a processing chamber through a pump throat or valve throat. Without a heat shield 33, an even higher maximum theoretical pumping speed can be achieved. However, the heat shield 33 is preferably provided to shield the getter material from heated surfaces within the chamber 18, such as the aforementioned bake-out lamps. The heat shield is also helpful in achieving regeneration temperatures for the getter material by reflecting back radiated heat from the getter material and heater.

Once the argon gas is flowing through the chamber 18 and into cryopump 22, the plasma generator 26 is activated to create ("strike") a plasma discharge within the chamber 18. There are a number of ways to create a plasma within the chamber, including applying a radio-frequency (RF) signal to the sputter target, as is well known to those skilled in the art. As it is also well known to those skilled in the art, the plasma creates positively charged argon ions which bombard the negatively charged or grounded sputter target causing a shower of material to fall on the wafer 40. The type of material being sputtered depends on the composition of the sputter target. Typically, such materials as aluminum, titanium, and titanium-tungsten are used as sputter targets to deposit aluminum, titanium, and titanium-tungsten, respectively, on the surface of the wafer.

An in situ getter pump system 30 in accordance with the present invention includes the getter module 32, the shield 33, the voltage source 34, the RGA 36, and the controller 38. As such, only a portion of the entire system is actually located within the chamber 18. However, the active portion of system 30, i.e. the getter module(s) 32 are located within the chamber 18. The heat shield 33 is also preferably located within the chamber to shield the active surfaces of the getter module 32 from heated surfaces within the chamber. The heat shield can be eliminated if the getter modules are positioned or otherwise shielded to prevent interference by heated surfaces within the chamber. The heat shield 33 can be a fixed shield made, for example, from stainless steel, or can be a movable shield which is open during operation and which closes under certain conditions (such as opening the chamber 18).

It is preferable for the getter system controller 38 communicate with the sputter system controller 28 through an interface bus 55 so that the in situ pump is not operated under adverse conditions, such as when the chamber 18 is open for maintenance and repair. Alternatively, the controllers 28 and 38 can be combined into a single controller as will be appreciated by those skilled in the art.

Preferably, the getter module 32 includes a heater 56 which allows the temperature of the getter material within the getter module 32 to be selected. A thermocouple 58 is used to provide temperature feedback such that the temperature of the getter material within the getter module 32 can be accurately controlled. The voltage source 34 is coupled to the heater 56 by a cable 60 and provides power to energize the heater 56. The voltage source is variable in that in can be turned on or off, or it that can obtain a number of different voltage levels, or it can obtain a range of voltage levels. The voltage source 34 can be turned on or off or its voltage adjusted by a signal sent over a bus 62 from the controller 38.

The residual gas analyzer (RGA) 36 is coupled to the processing chamber 18 by a sensor 64 and a cable 66. By "coupled" it is meant herein that the analyzer 36 can receive information concerning the composition and concentration of the gas within chamber 18. For example, an analyzer can be optically coupled to chamber 18 by having photodetectors that can view the plasma within chamber 18 through a quartz porthole (not shown). However, in this preferred embodiment, the analyzer is physically coupled to the chamber 18 by the sensor 64 and the cable 66.

A suitable RGA 36 can be obtained under the trademark Transpector® from Leybold Inficon, Inc. of East Syracuse, N.Y. The purpose of RGA 26 is to determine what gases are present within the chamber 18, and in what concentrations. This information is provided to controller 38 via a bus 68.

In operation, the controller 38 receives information about the composition and concentration of the gas within chamber 18 from the RGA 36 over bus 68. It also receives information concerning the current temperature of the getter material within getter module 32 over a bus 70. The controller 38 then determines whether the temperature of the getter material within getter module 32 should be adjusted in order to change the pumping characteristics of the getter module 32. For example, if RGA 36 determines that there is a high concentration of hydrogen gas within chamber 18, and if the thermocouple 38 indicates that the getter module 32 is currently operating at a high temperature, the controller 38 can send a signal to voltage source 34 over bus 62 to cause the voltage source 34 to turn off. This turns off heater 56 which allows the getter module 32 to cool to a lower temperature. At lower temperatures, getter materials such as the aforementioned ST707 and ST101 aggressively adsorb hydrogen, thus quickly reducing the concentration of hydrogen within the chamber 18. If, in another example, RGA 36 detects a high level of water vapor and if the temperature of the getter module 32 is low, the controller 38 causes voltage source 34 to increase the heat output of heater 56 to heat the getter material to the 300–450° C. range to quickly and effectively pump the water vapor from the chamber 18.

Figure 2:
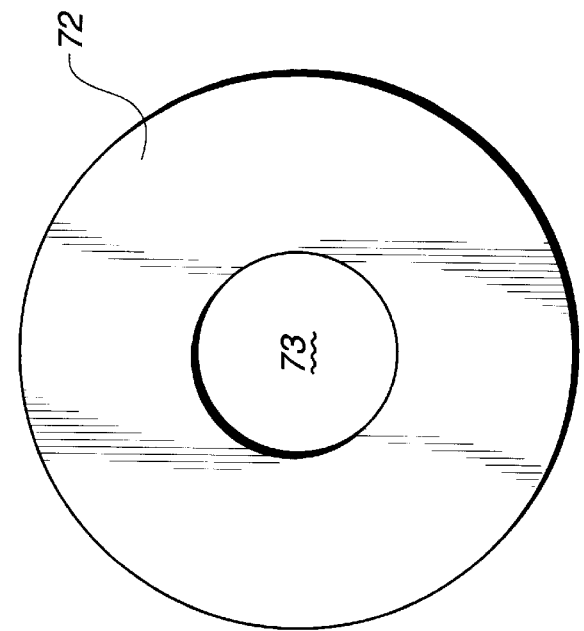
FIG. 2 is a cross sectional view taken along line 2—2 of FIG. 1 of a cryopump baffle plate.

With additional reference to FIG. 2, the cryopump 22 is preferably coupled to the gate valve 50 by a throttle plate 72. As explained previously, the throttle plate 72 reduces the conductance between the processing chamber 18 and the cryopump 22. If, for example, the cryopump has an 8" mouth, the throttle plate 72 will be slightly greater than 8" in diameter and will be provided with one or more holes 73 (or other apertures such as slits) through which the gas can flow into the cryopump 32 from the process chamber 18. The conductance of a cryopump would typically be reduced by a factor of about 50–70 percent, and almost certainly more than 25%, by the chosen throttle plate design. This allows the use of high capacity cryopump that does not have to be regenerated very frequently and yet has a low enough conductance such that excessive amounts of argon gas do not need to flow into chamber 18 during processing. Alternatively, a much smaller cryopump 22 can be used without a throttle plate 72, with the trade-off that the cryopump will have to be regenerated more frequently as it became saturated with argon gas.

The in situ getter pump system 30 therefore has a special relationship with the cryopump 22. Since the conductance of the cryopump 22 must be limited so that excessive amounts of argon (or other noble gasses) are not required during processing, the in situ getter pump can be used to boost pumping speeds both during pump-down to base pressures and during the processing of semiconductor wafers. Since the in situ getter pump does not pump noble gases such as argon, it is ideally suited to be used with a cryopump 22 having an intentionally limited conductance.

Figure 3A:
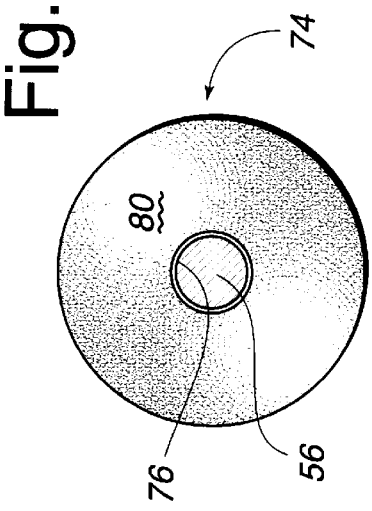
FIG. 3a is a view taken along line 3a—3a of FIG. 3 and illustrates a single getter element of the present invention.
Figure 3:
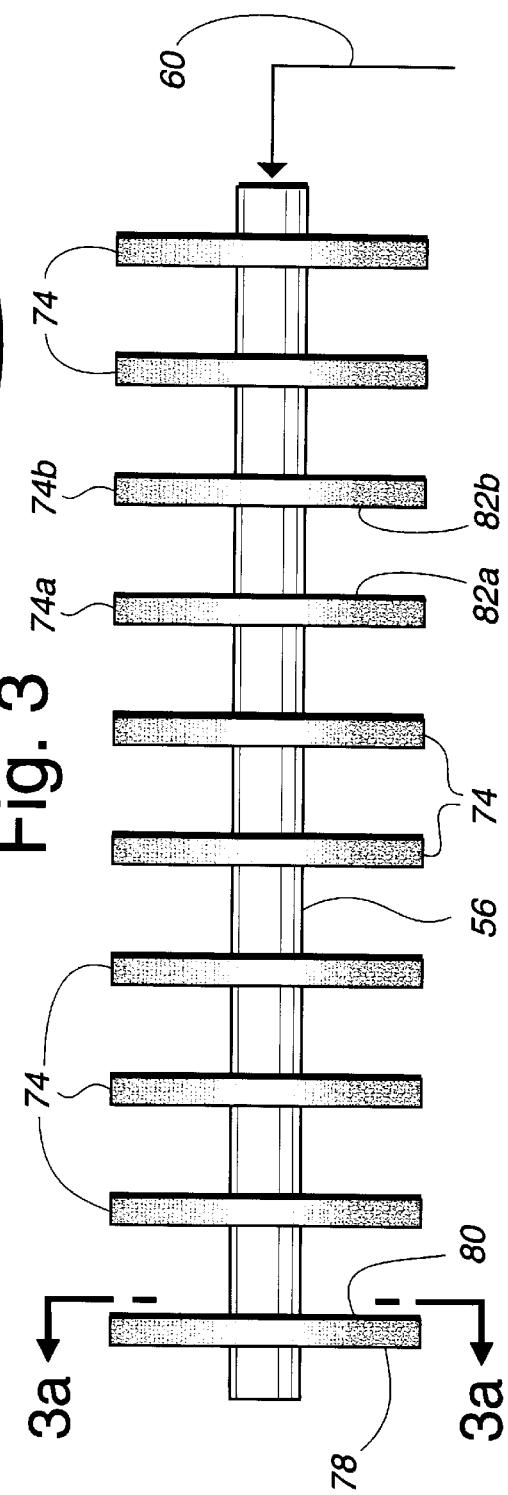
FIG. 3 is a side elevational view of a getter module in accordance with the present invention.

In FIG. 3, a preferred configuration for getter module 32 is disclosed. Preferably, the getter module 32 includes a number of getter elements 74 arranged in a spaced-apart configuration. With additional reference to the cross-sectional view of FIG. 3a, each of the getter elements is provided with a centrally located aperture (hole) 76 which is receptive to an elongated heater 56. Preferably, each getter element 74 is substantially disk shaped with an axial bore forming the centrally located aperture 76. Each getter element 74 has a pair of opposing sides 78 and 80 and can be any one of a number of suitable getter materials, including the getter material sold under the trademarks ST707 or ST101 by SAES Getters, S.p.A., Milan, Italy. These getter elements are preferably porous, sintered getter elements such as those disclosed in U.S. Pat. No. 5,320,496 of Manini et al., assigned to SAES Getters SpA, and incorporated herein by reference. Porous getter material is sold by SAES Getters, SpA, under the trademark ST172. The manufacture of porous getter material is described in British Patent No. 2,077,487 which is assigned to SAES Getters, SpA, and which is incorporated herein by reference.

In the embodiment of FIG. 3, adjacent getter elements 74, such as getter elements 74a and 74b, include facing surfaces 82a and 82b. In the embodiment of FIG. 3, the surfaces 82a and 82b are substantially planar and substantially parallel. By "substantially planar" it is meant that the surface is essentially planar, although some degree of variance from perfect planarity is acceptable. By "substantially parallel" it is meant that the surfaces are essentially parallel, although some small variance (e.g. ±5° of variance) can be acceptable. In other embodiments of the present invention getter elements can have non-planar surfaces or planar facing surfaces that are not parallel. For example, facing surfaces (such as surfaces 82a and 82b) can define a pair of planes (even if they are not completely planar) which intersect with an included angle of about 5 degrees or less. This may, in some instances, enhance adsorption of selected gasses. In the embodiment of FIG. 3b, adjacent getter elements 74, such as getter elements 74a and 74b, are angled relative to each other such that the planes defined by facing surfaces 82a and 82b intersect with an included angle α of about 5 degrees or less.

The heater 56 can be any suitable heating element. The requirements of the heater 56 is that it should be able to heat the getter elements 74 to a desired operating temperature profile. This profile is preferably uniform, but may include a gradient or discontinuities in temperature along the length of the getter module.

If, for example, ST707 getter material is used, it is desirable that the heater be able to heat the getter elements 74 in the range of 25–300° C. during operation, and to a higher temperature of 450–500° C. for activation. However, if the getter module 32 is to be used to pump hydrogen, the heater 56 does not typically need to be energized, since ST707 getter material pumps hydrogen very well at room temperatures.

Nonetheless, even if heater 56 is not used to heat the getter element 74 to their operating temperature, they can be used to activate the getter material within the getter elements 74. For example, ST707 getter material can be activated (regenerated) by heating to 450–500° C. and ST707 can be activated by heating to 600–700° C. However, regeneration may not be required since the getter module 32 can be considered simply as a disposable or consumable item that is replaced during routine maintenance.

While the heater 56 has been described as the central shaft which supports the getter elements 74, the getter elements can also be supported by a non-heated shaft or may be supported in other ways. The heater 56 can then be separate from the structural support for the getter elements 74, such as radiant lamps positioned near the getter elements.

As mentioned previously, there are several technologies for providing the heater 56. For example, a resistive, inductive, or radiant heater can be provided. However, in the present preferred embodiment the heater 56 is a resistive heater such as that shown in the Manini et al. patent. The heater should be able to heat in a range from ambient or room temperature to at least operational temperatures of the getter materials. Preferably, the heater should be able to heat the getter materials to their activation temperatures.

Figure 3C:
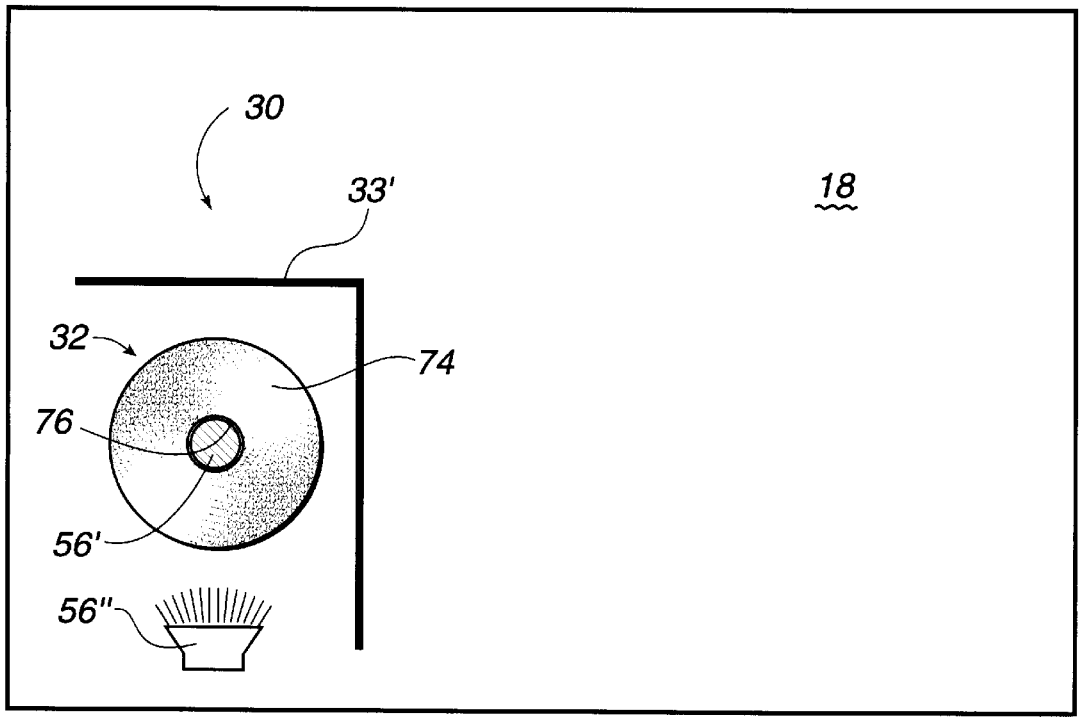
FIG. 3c is a schematic diagram illustrating one embodiment of an in situ getter pump system of the present invention.
Figure 3D:
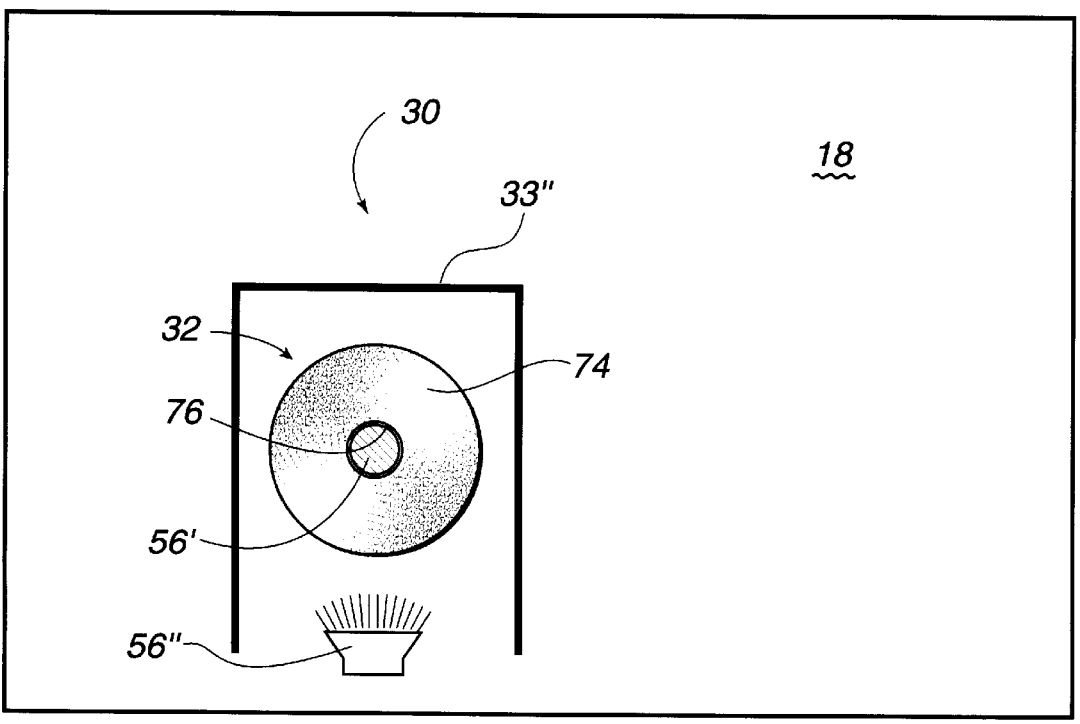
FIG. 3d is a schematic diagram illustrating another embodiment of an in situ getter pump system of the present invention.

FIGS. 3c and 3d illustrate exemplary configurations of in situ getter pump system 30 within processing chamber 18. In the embodiments of FIGS. 3c and 3d, getter module 32 includes getter elements 74 supported on shaft 56' which extends through apertures 76 of getter elements 74. Radiant heater 56", e.g., a radiant lamp, is positioned near and heats getter elements 74. In the embodiment of FIG. 3c, heat shield 33' shields the active surfaces of getter module 32, i.e., getter elements 74, from heated surfaces within chamber 18. In the embodiment of FIG. 3d, heat shield 33" shields the active surfaces of getter module 32, i.e., getter elements 74, from heated surfaces within chamber 18.

Figure 4:
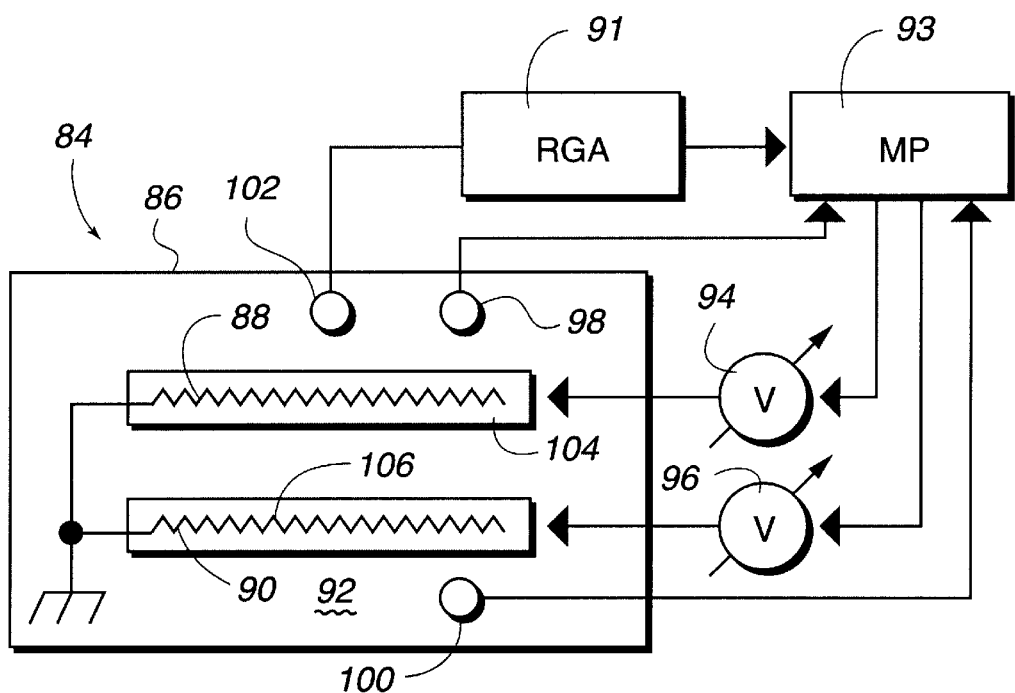
FIG. 4 is a block diagram of another embodiment of an in situ getter pump system of the present invention.

In FIG. 4, a processing chamber 84 in accordance with the present invention includes a sealable enclosure 86 and two getter modules 88 and 90 disposed within a chamber 92 defined by the enclosure 86. The system 84 also includes an RGA 90 and a microprocessor-controlled system 92. Of course, as it is the case with all controllers such as controller 92, the controller function can be accomplished by a number of equivalent electrical or electronic systems. For example, a controller can include analog circuitry, discrete digital logic, a microprocessor, a mini-computer, etc. The system 84 also includes a pair of voltage sources 94 and 96. The enclosure 86 can be of any conventional design, although it is conveniently manufactured from welded stainless steel. The enclosure 86 is preferably provided with a slit valve (not shown) or the equivalent such that a workpiece can be conveniently inserted into and removed from the chamber 92. When sealed, enclosure 86 isolates the chamber 92 from the ambient environment.

There are number of reasons why two or more (i.e. a plurality) of getter modules such as getter module 88 and 90 are provided within the chamber 92. For example, the two in situ getter modules 88 and 90 can be simply operated in parallel to double the capacity and pumping rate of the in situ getter system. Alternatively, the getter modules 88 and 90 can be made with different getter materials and/or be operated at different operating temperatures. For example, getter module 88 can be made with ST707 getter material and operated at 300–400° C. to preferentially pump most non-noble gases except hydrogen, while getter module 90 can be made with ST101 getter material and left at room temperature to preferentially pump hydrogen. Therefore, a wide range of non-noble gases can be pumped with the combination of the two getter modules.

Preferably, the system 84 is controlled in a closed-loop fashion, i.e. it operates under feedback control. Thermocouples (or the equivalent) 98 and 100 are used to monitor the temperature of getter modules 88 and 90, respectively, and sensor 102 is used by RGA circuitry 91 to detect the composition and concentration of the gases within chamber 92. The controller 93 uses the inputs from the RGA circuitry 91 and the thermocouples 98 and 100 to produce signals which control voltage sources 94 and 96 coupled to heaters 104 and 106, respectively, of getter modules 88 and 90, respectively.

Figure 5:
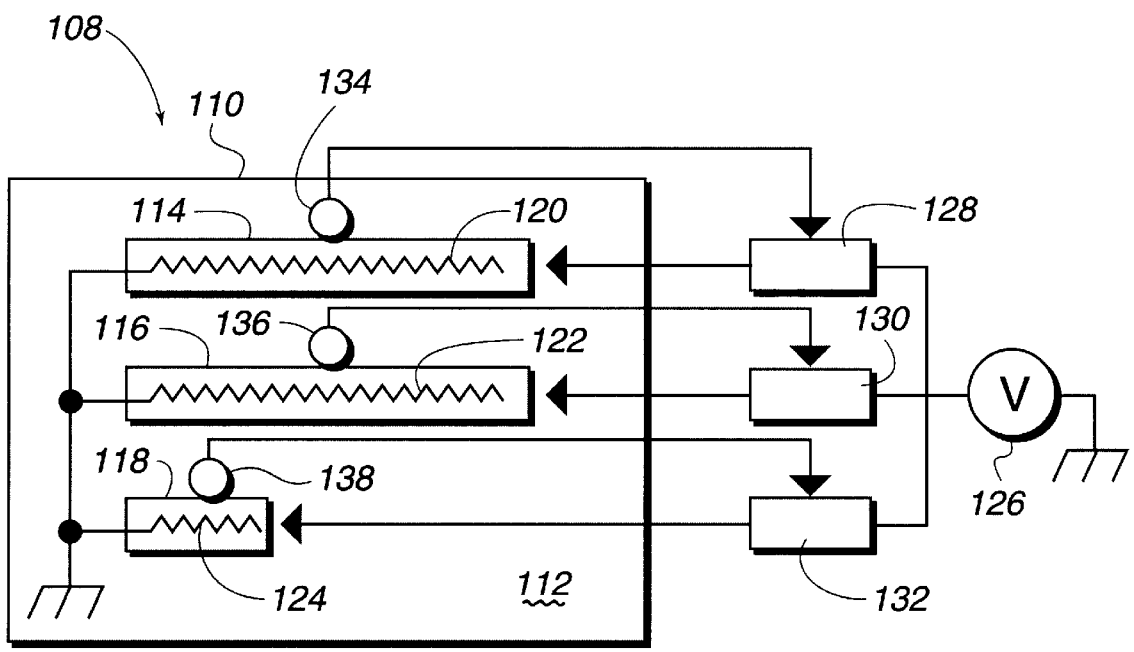
FIG. 5 is another alternate embodiment of an in situ getter pump system of the present invention.

In FIG. 5, a processing system 108 includes a sealable enclosure 110 defining a chamber 112 and three getter modules 114, 116, and 118. It should be noted that each getter module 114–118 can be independently controlled, and can be of different sizes. For example, getter module 114 can include ST101 getter material and can be left unheated so as to remain at room temperature to preferentially pump hydrogen gas, getter 116 can include ST707 getter material heated to a temperature of 300–450° C. to pump non-noble gases, and getter module 118 can include yet another getter material operating at yet another temperature to supplement the pumping capabilities of getter modules 114 and 116. In this instance, the heater 120, 122, and 124 of getter modules 114, 116, and 118, respectively, are coupled to a voltage source 126 by temperature controllers 128, 130, and 132, respectively. The controllers 128–132 maintain the heaters 120–124 at a desired, but fixed temperatures as sensed by thermocouples 134, 136, and 138, respectively. Therefore, while the temperature controllers for each individual getter module 114–118 is a closed-loop or feedback system, the system 108 is not a closed-loop or feedback system with respect to the composition and concentration of gases within chamber 112 in that the getter modules 114–118 always will operate at the same temperature. However, for well documented processes, the getter modules and their operating parameters can be fixed to operate well under most normal conditions.

Figure 6:
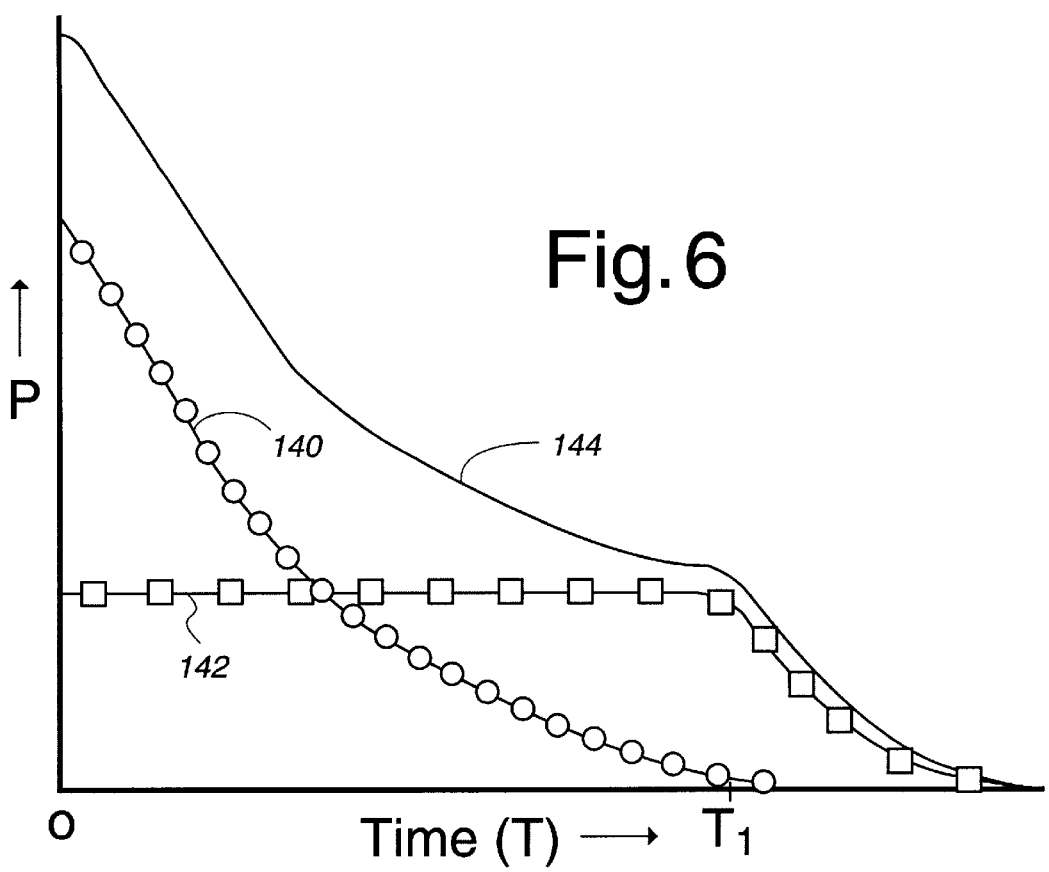
FIG. 6 is a graph of the pressure within a chamber according to a first pump-down process of the present invention.

In FIG. 6, a graph illustrates one preferred method for operating an in situ getter pump in accordance with the present invention. In this graph, pressure P within a chamber is shown along the vertical axis, while time T is shown along the horizontal axis. A first line 140 illustrates the partial pressure of water vapor within the chamber over time, while a second line 142 illustrates the partial pressure of hydrogen within the chamber over time. The combination of the water vapor 140 and the hydrogen 142 in this example creates the combined pressure 144 within the processing chamber.

With reference to the illustration of FIG. 6, a process for using a single getter module, such as the getter module 32 of FIG. 1, as an in situ getter pump after activation and during pump-down will be described. It should be noted that the graph of FIG. 6 is for the purpose of illustration only, and actual partial pressure curves will vary. It will be assumed, in this instance, that the getter module 32 includes a ST707 type getter material which adsorbs water vapor ($H_2O$) very well when heated to temperatures in the range of 300–450° C., e.g. to about 350° C. The ST707 also adsorbs hydrogen well at lower temperatures such as at room temperature, e.g. 25° C. or thereabouts. In this instance, the RGA 36 detects a high level of water vapor at a time t=0 and a controller 38 causes the voltage source 34 to turn on the heater to heat the getter module 32 to about 350° C. This causes a very rapid decrease in water vapor levels until a time t=T1 when the water vapor is essentially removed from the chamber. However, the hydrogen partial pressure stays substantially constant because ST707 does not adsorb hydrogen well at high temperatures. Once the RGA 36 detects that the water vapor level is low within chamber 18 and the hydrogen level 42 is high, at a time t=T1 the system 38 causes the voltage source 34 to turn off, turning off the heater and allowing the getter module 32 to cool and start adsorbing hydrogen. Therefore, as illustrated in FIG. 6, a single getter module operated at two different temperatures can quickly and effectively remove non-noble gases from the chamber 18 without interfering with the flow of the noble gas through the chamber.

Figure 7:
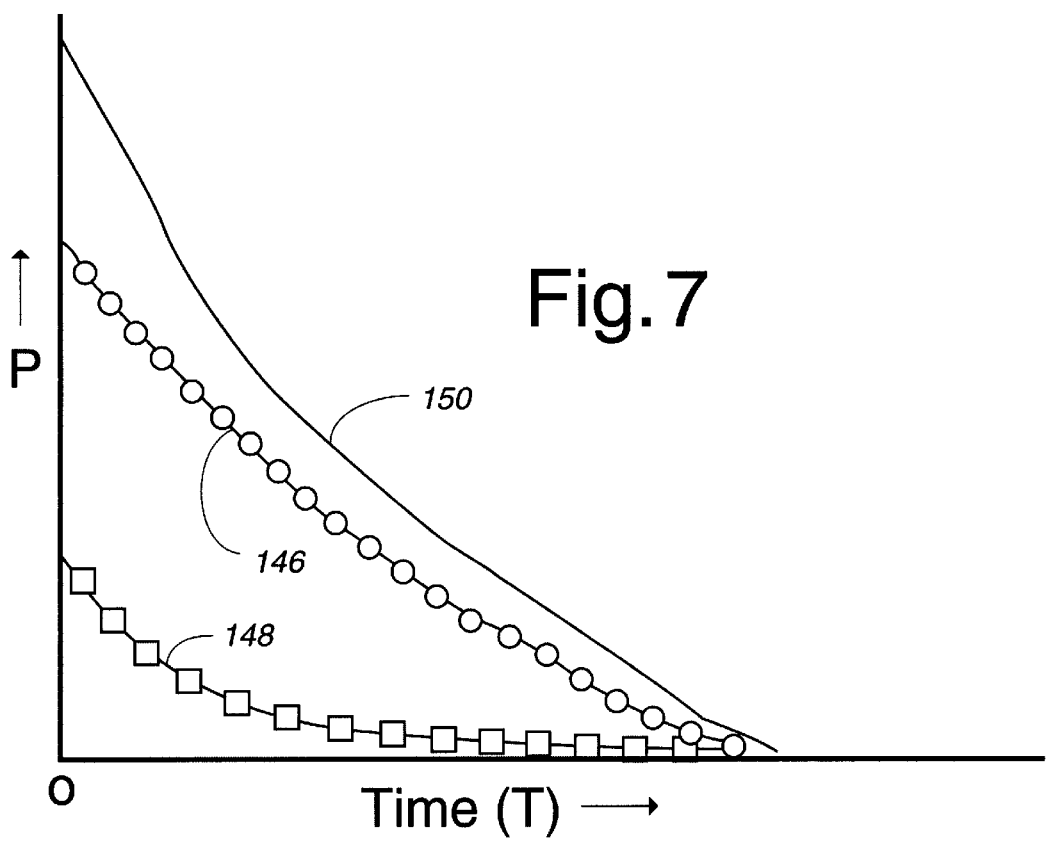
FIG. 7 is a graph of the pressure within a chamber according to a second pump-down process of the present invention.

In FIG. 7, a graph illustrates the operation of a system having multiple getter modules, such as the system 84 illustrated in FIG. 4. Again, it should be noted that the graph of FIG. 7 is for the purpose of illustration only, and actual partial pressure curves will vary. In this example, the partial pressure due to water vapor is shown by the line 146, while the partial pressure due to hydrogen is shown by the line 148. The total pressure within the chamber 92, in this example, is shown by line 150. Since the RGA 91 detects concentrations of both water vapor and hydrogen, the microprocessor 93 causes the voltage source 94 to turn on and the voltage source 96 to turn off. This causes the getter module 88 to heat to a temperature of about 350° C., thereby quickly pumping the water vapor from the chamber 92, while allowing the module 90 to operate at about ambient temperatures so that it may quickly pump hydrogen from the chamber 92.

It will be noted that the multiple module systems can achieve greater pumping speeds due to greater surface area and due to the fact that multiple species of gas can be pumped simultaneously. However, the multiple in situ getter modules create more expensive systems than the single getter module system first described.

Figure 8:
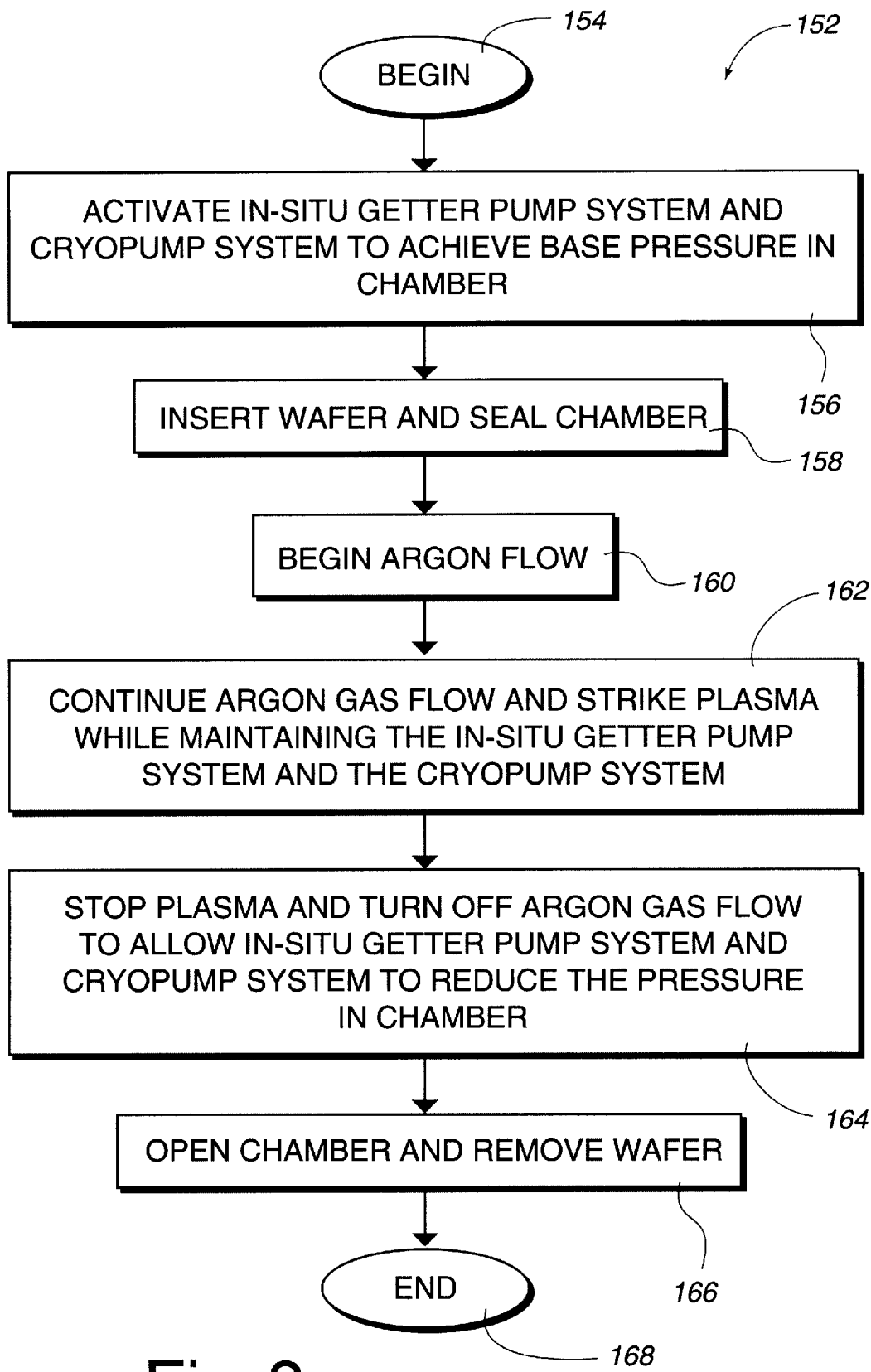
FIG. 8 is a flow diagram illustrating a process in accordance with the present invention.

In FIG. 8, a process 152 for processing a wafer in accordance with the present invention begins at step 154 and, in a step 156, an in situ getter pump is activated in conjunction with a cryopump to develop a base pressure in a chamber. Next, in a step 158, a wafer is inserted into the chamber and the chamber is sealed. In a step 160, argon begins to flow into the chamber, and in a step 162 the argon gas continues to flow and a plasma is created while maintaining both the in situ pump system and the cryopump system. Next, in a step 164, the plasma stops and the argon gas is turned off to allow the in situ pump system and the cryopump system to reduce pressure in the chamber. The processed wafer is then removed from the chamber in a step 166 and the process ends at step 168.

Figure 9:
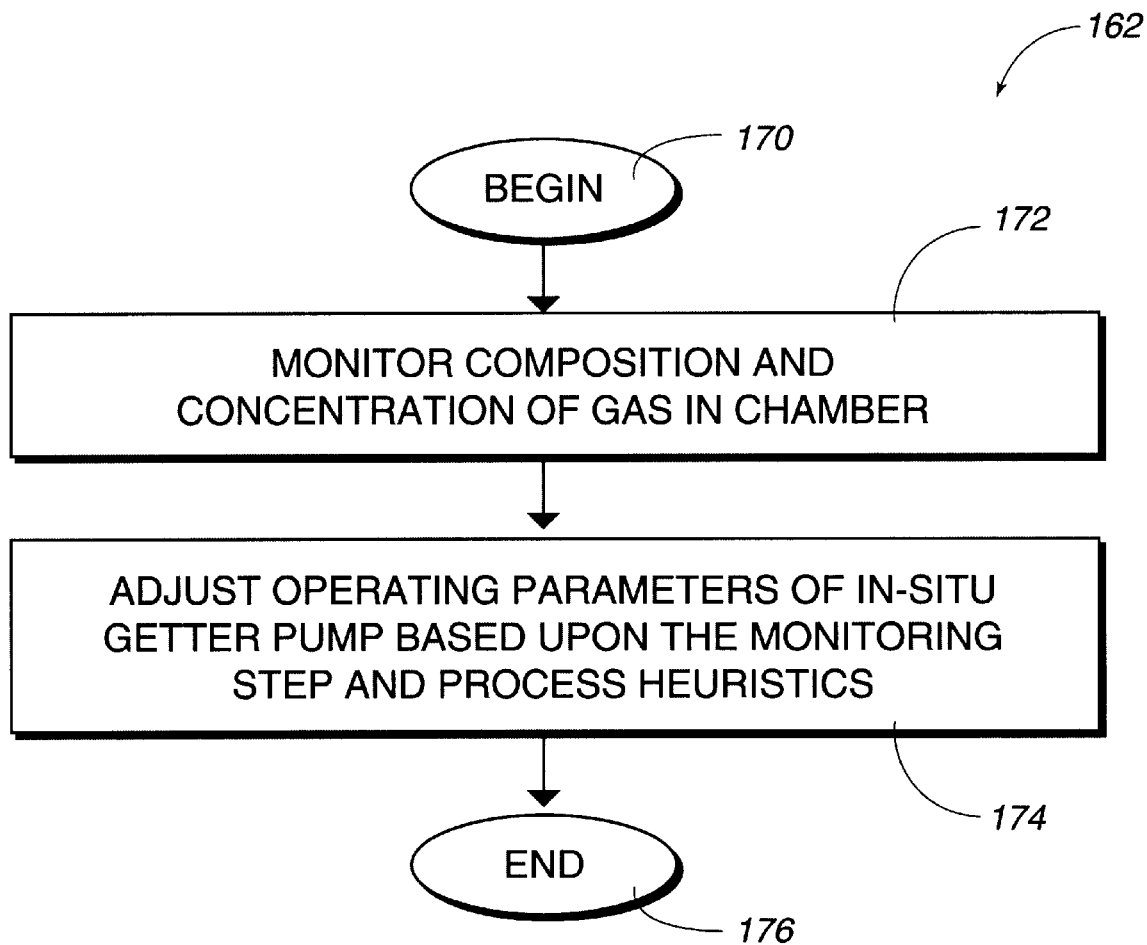
FIG. 9 is a flow diagram illustrating step 162 of FIG. 8 in greater detail.

A preferred process 162 corresponding to step 162 of FIG. 8 is illustrated in FIG. 9. The process 162 begins at 170 and, in a step 172, the composition and concentration of the gas and the chamber is monitored. Next, in a step 174, the operating parameters of the in situ getter pump are adjusted based upon the monitoring step and certain process heuristics. The process 162 ends at 176.

It should be noted that the process 162 illustrated in FIG. 9 is an embodiment of the closed-loop or feedback process. Of course, the open-loop processes described are also viable and may be preferable for certain applications. The operating parameters of the in situ getter pump referred to in step 174 can include activating one or more getter modules, changing the temperature of a getter module, etc. Process heuristics are rules-of-thumb implemented by the system designer to optimize the process. For example, the system designer might decide that the temperature on a getter module having ST707 getter material should be dropped from 350° to ambient temperature when the partial pressure of water vapor reaches a certain level, or after a predetermined period of time, etc.

While this invention has been described in terms of several preferred embodiments, there are alterations, permutations, and equivalents which fall within the scope of this invention. It should also be noted that there are may alternative ways of implementing both the process and apparatus of the present invention. For example, while ST707 and ST101 getter material has been disclosed during the above discussion of the preferred embodiments of the present invention, it will be appreciated by those skilled in the art that other getter materials and compounds are also suitable for use in the present invention. Also, while cryopumps have been primarily described in relation to the present invention, it will be appreciated that molecular pumps, ion pumps, turbo pumps, etc. may also or equivalently be employed.

It is therefore intended that the following appended claims be interpreted as including all such alterations, permutations, and equivalents as fall within the true spirit and scope of the present invention.

What is claimed is:

1. An in situ getter pump module comprising:
    a plurality of getter elements that are spaced apart such that adjacent getter elements do not abut, where each getter element is provided with a centrally located aperture, each getter element has a pair of opposing sides, and facing sides of adjacent getter elements have nonparallel facing surfaces; and
    a heater disposed through the apertures of said getter elements to support and heat said getter elements.

2. An in situ getter pump module as recited in claim 1 wherein each getter element is substantially disk shaped with an axial bore forming said centrally located aperture.

3. An in situ getter pump module as recited in claim 1 wherein said facing surfaces define a pair of planes which intersect with an included angle of less than about 5 degrees.

4. An in situ getter pump module as recited in claim 1 wherein said getter elements are substantially planar, and wherein adjacent getter elements are angled relative to each other.

5. An in situ getter pump module as recited in claim 1 wherein said getter elements are substantially parallel and wherein facing surfaces between adjacent getter elements are angled relative to each other.

6. An in situ getter pump module as recited in claim 1 wherein said heater is an electrically resistive heater.

7. An in situ getter pump module as recited in claim 1 wherein said heater is a radiant heater.

8. An in situ getter pump module comprising:
    a plurality of getter elements that are spaced apart such that adjacent getter elements do not abut, where each getter element is provided with a centrally located aperture;
    a shaft disposed through the apertures of said getter elements to support said getter elements; and
    a radiant heater positioned near said getter elements to heat said getter elements, said radiant heater being separated from said shaft.

9. An in situ getter pump module as recited in claim 8, wherein the radiant heater is a lamp.

10. An in situ getter pump module as recited in claim 8, further comprising a heat shield to shield said getter elements from heated surfaces within a processing chamber.

11. An in situ getter pump module as recited in claim 8, wherein the getter elements are substantially disk shaped and are comprised of a porous, sintered getter material.

12. An in situ getter pump system comprising:

a processing chamber;

a getter pump module disposed in said processing chamber; said getter pump module being comprised of a plurality of getter elements, where each getter element is provided with a centrally located aperture, a shaft disposed through the apertures of said getter elements to support said getter elements, and a radiant heater positioned near said getter elements to heat said getter elements; and a heat shield disposed in said processing chamber adjacent to said getter elements to shield said getter elements from heated surfaces within said processing chamber.

13. An in situ getter pump system as recited in claim 12, wherein the radiant heater is a lamp.

14. An in situ getter pump system as recited in claim 13, wherein the getter elements are substantially disk shaped and are comprised of a porous, sintered getter material.

* * * * *